US008216928B1

(12) United States Patent
Richter et al.

(10) Patent No.: US 8,216,928 B1
(45) Date of Patent: Jul. 10, 2012

(54) METHODS FOR FABRICATING SEMICONDUCTOR DEVICES HAVING LOCAL CONTACTS

(75) Inventors: Ralf Richter, Dresden (DE); Torsten Huisinga, Dresden (DE); Jens Heinrich, Wachau (DE)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/014,561

(22) Filed: Jan. 26, 2011

(51) Int. Cl.
*H01L 21/44* (2006.01)

(52) U.S. Cl. ........... 438/597; 257/E21.42; 257/E21.507; 257/E21.627; 257/E21.641; 438/233; 438/256; 438/523; 438/571; 438/586; 438/618

(58) Field of Classification Search ........... 257/E21.627, 257/E21.641, E21.42, E21.507; 438/233, 438/256, 523, 571, 586, 597, 618
See application file for complete search history.

(56) References Cited

U.S. PATENT DOCUMENTS

| 2008/0012019 A1* | 1/2008 | Zhu et al. ..................... 257/69 |
| 2010/0210083 A1* | 8/2010 | Fukuda et al. .............. 438/285 |

OTHER PUBLICATIONS

U.S. Appl. No. 12/968,068, filed Dec. 14, 2010.

* cited by examiner

*Primary Examiner* — Asok Sarkar
(74) *Attorney, Agent, or Firm* — Ingrassia Fisher & Lorenz, P.C.

(57) ABSTRACT

Fabrication methods for semiconductor device structures are provided. One method for fabricating a semiconductor device structure that includes a gate structure overlying a semiconductor substrate and a doped region formed in the semiconductor substrate adjacent to the gate structure involves the steps of forming a first layer of dielectric material overlying the gate structure and the doped region, isotropically etching the first layer of dielectric material, forming a second layer of dielectric material overlying the first layer of dielectric material after isotropically etching the first layer, and forming a conductive contact that is electrically connected to the doped region within the first layer and the second layer.

20 Claims, 10 Drawing Sheets

US 8,216,928 B1

METHODS FOR FABRICATING SEMICONDUCTOR DEVICES HAVING LOCAL CONTACTS

TECHNICAL FIELD

Embodiments of the subject matter generally relate to semiconductor device fabrication methods, and more particularly, relate to fabrication methods for forming local contacts to doped regions formed in a semiconductor substrate.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry. As the size and spacing of the transistors decrease, it is more difficult to avoid inadvertent creation of electrical connections between adjacent devices, which, in turn, reduces yield.

BRIEF SUMMARY

A method is provided for fabricating a semiconductor device structure. The semiconductor device includes a gate structure overlying a semiconductor substrate and a doped region formed in the semiconductor substrate adjacent to the gate structure. The method involves the steps of forming a first layer of dielectric material overlying the gate structure and the doped region, isotropically etching the first layer of dielectric material, forming a second layer of dielectric material overlying the first layer of dielectric material after isotropically etching the first layer, and forming a conductive contact within the first layer and the second layer. The conductive contact is electrically connected to the doped region.

In another embodiment, a method is provided for fabricating a CMOS device on a semiconductor substrate having a first transistor region and a second transistor region. The method involves the steps of forming a layer of a stress-inducing material overlying the first transistor region and the second transistor region, removing portions of the stress-inducing material overlying the second transistor region, and isotropically etching portions of the stress-inducing material overlying the first transistor region after removing the portions of the stress-inducing material overlying the second transistor region. The method continues by forming a layer of a dielectric material overlying the first transistor region and the second transistor region, and forming conductive contacts in the layer of the dielectric material that are electrically connected to doped regions formed in the semiconductor substrate.

In yet another embodiment, a method is provided for fabricating a semiconductor device that includes a plurality of gate structures overlying a semiconductor substrate and doped regions formed in the semiconductor substrate adjacent to each respective gate structure. The method involves the steps of conformably depositing a stress-inducing nitride material overlying the gate structures and the doped regions, isotropically etching portions of the stress-inducing nitride material overlying the gate structures, conformably depositing an oxide material overlying the stress-inducing nitride material after isotropically etching the portions of the stress-inducing nitride material overlying the gate structures, and forming conductive contacts in the oxide material. Each conductive contact overlies and is electrically connected to a respective doped region.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

FIGS. 1-9 illustrate a CMOS semiconductor device structure 100 and related process steps for fabricating the CMOS semiconductor device structure 100 with conductive electrical contacts (also referred to herein as local contacts) to doped source/drain regions formed in a semiconductor substrate. Although the subject matter is described herein in the context of a CMOS semiconductor device, the subject matter is not intended to be limited to CMOS semiconductor devices, and may be utilized with other MOS semiconductor devices which are not CMOS semiconductor devices. Additionally, although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the fabrication of MOS semiconductor devices are well known and so, in the interest of brevity, many conventional steps will only be mentioned briefly herein or will be omitted entirely without providing the well known process details.

Figure 1:
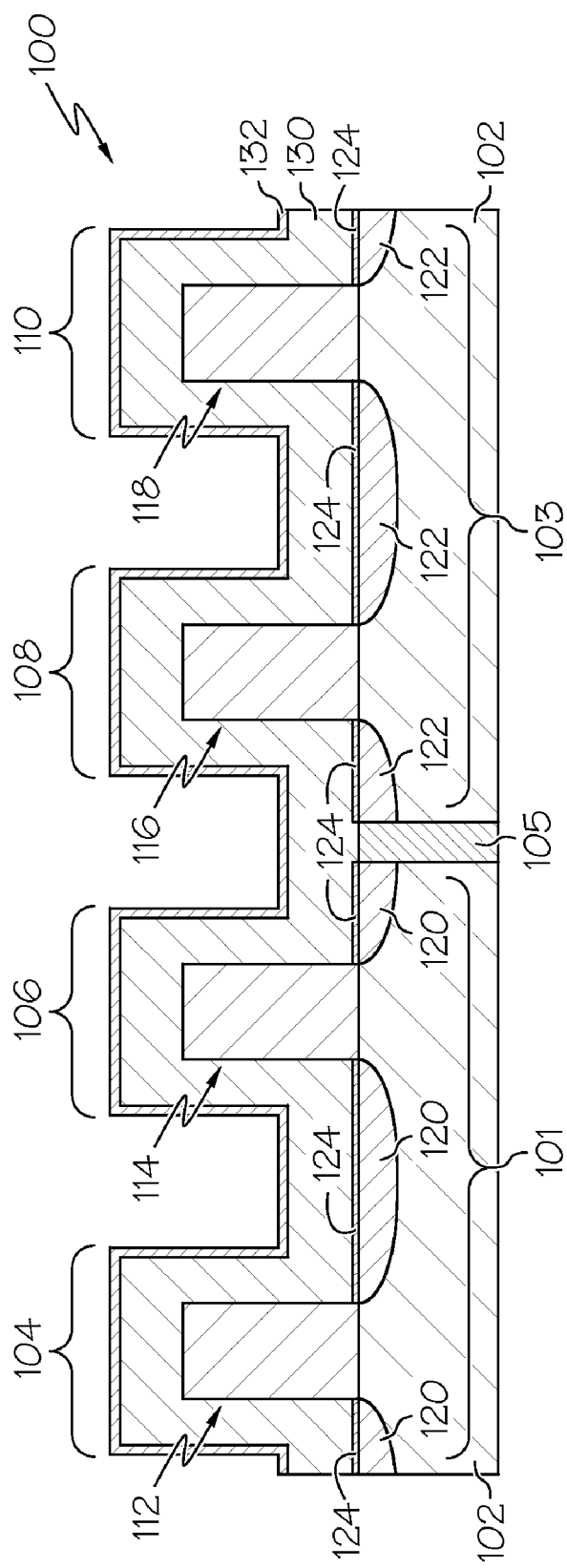
FIGS. 1-9 are cross-sectional views that illustrate a CMOS semiconductor device structure and methods for fabricating the CMOS semiconductor device structure in exemplary embodiments.

Referring now to FIG. 1, the fabrication process begins after front end of line (FEOL) processing steps are performed to fabricate a CMOS semiconductor device structure 100 that includes a plurality of MOS transistor structures 104, 106, 108, 110 formed on electrically isolated regions 101, 103 of a substrate of a semiconductive material 102, such as monocrystalline silicon or another silicon-comprising material, in a conventional manner. For example, the regions 101, 103 of the semiconductor material 102 may be isolated by performing shallow trench isolation (STI) or another suitable process known in the art to form an insulating material 105, such as silicon dioxide, in between the regions 101, 103 of the semiconductor material 102. The insulating material 105 may hereinafter be referred to for convenience, but without limitation, as the field oxide. In an exemplary embodiment, the isolated regions 101, 103 are doped in a conventional manner to achieve a desired dopant profile for the body regions (or well regions) of the transistor structures 104, 106, 108, 110. For example, an N-type region 101 of semiconductor material 102 may be formed by masking region 103 and implanting N-type ions, such as phosphorous or arsenic ions, into region 101. In this regard, portions of the N-type region 101 functions as N-wells for PMOS transistor structures 104, 106 formed on region 101. Similarly, the N-type region 101 may be masked and P-wells for NMOS transistor structures 108, 110 may be formed in region 103 by implanting P-type ions, such as boron ions, into region 103. For convenience, the N-type (or N-well) region 101 may alternatively be referred to herein as the PMOS transistor region and P-type (or P-well) region 103 may alternatively be referred to herein as the NMOS transistor region.

As illustrated in FIG. 1, each transistor structure 104, 106, 108, 110 includes a gate structure 112, 114, 116, 118 overlying the semiconductor substrate 102 that functions as a gate electrode for the respective transistor structure 104, 106, 108, 110. The gate structures 112, 114, 116, 118 can be created using a conventional gate stack module or any combination of well-known process steps. In practice, each gate structure 112, 114, 116, 118 typically includes at least one layer of dielectric material overlying the semiconductor substrate 102, and at least one layer of conductive material overlying the dielectric material. It should be understood that various numbers, combinations and/or arrangements of materials may be utilized for the gate structures in a practical embodiment, and the subject matter described herein is not limited to any particular number, combination, or arrangement of gate material(s) in the gate structure. Additionally, the subject matter is not intended to be limited to any particular number of gate structures. Each transistor structure 104, 106, 108, 110 also includes spaced-apart doped regions 120, 122 formed in the semiconductor substrate 102 adjacent to its respective gate structure 112, 114, 116, 118 that function as source/drain regions for the respective transistor structures 104, 106, 108, 110, and accordingly, for convenience, but without limitation, the doped regions 120, 122 are alternately referred to herein as source/drain regions. In this regard, P-type source/drain regions 120 for the PMOS transistor structures 104, 106 may be formed by implanting P-type ions, such as boron ions, into the PMOS transistor region 101 using the gate structures 112, 114 as an implantation mask while the NMOS transistor region 103 is masked, and N-type source/drain regions 122 for the NMOS transistor structures 108, 110 may be formed by implanting N-type ions, such as phosphorous or arsenic ions, into the NMOS transistor region 103 using the gate structures 116, 118 as an implantation mask while the PMOS transistor region 101 is masked. It should be appreciated that although FIG. 1 depicts the source/drain regions as being integrally formed with or otherwise contiguous with source/drain regions of adjacent transistor structures for purposes of illustration, the subject matter is not intended to be limited to any particular arrangement of the source/drain regions.

In an exemplary embodiment, the source/drain regions 120, 122 include contact regions 124 formed on their upper surface to facilitate forming electrical connections between the source/drain regions 120, 122 of the transistor structures 104, 106, 108, 110 and an adjacent metal interconnect layer, as described in greater detail below. The contact regions 124 may be realized as a metal silicide layer formed on exposed upper surfaces of the source/drain regions 120, 122 in a conventional manner. Although not illustrated, in some embodiments, contact regions may also be formed on the upper surfaces of the conductive gate material of the gate structures 112, 114, 116, 118, as will be appreciated in the art.

Still referring to FIG. 1, in an exemplary embodiment, the fabrication process continues by forming a layer of a stress-inducing dielectric material 130 overlying the transistor structures 104, 106, 108, 110. For example, a layer of tensile stress-inducing material 130 may be formed by conformably depositing a layer of tensile stress-inducing silicon nitride using a plasma-enhanced chemical vapor deposition (PECVD) process. The desired amount of tensile stress provided by the deposited layer of silicon nitride material can be modified by adjusting the chamber conditions for the PECVD process (e.g., voltage, temperature, pressure, gas ratios, or the like) to achieve a layer of tensile stress-inducing silicon nitride material 130 having the desired tensile stress properties. For convenience, but without limitation, the stress-inducing dielectric material 130 is alternatively referred to herein as the tensile stress-inducing nitride material. The tensile stress-inducing nitride material 130 provides a tensile stress that increases the mobility of electrons in the channel region of the NMOS transistor structures 108, 110, as will be appreciated in the art.

In an exemplary embodiment, after forming the layer of tensile stress-inducing nitride material 130, the fabrication process continues by forming a layer of an oxide material 132 overlying the layer of tensile stress-inducing nitride material 130, resulting in the CMOS semiconductor device structure 100 of FIG. 1. The layer of oxide material 132 is formed by conformably depositing an oxide material overlying the layer of tensile stress-inducing material 130 using a chemical vapor deposition (CVD) process. The layer of oxide material 132 functions as an etch stop layer that protects the portions of the underlying tensile stress-inducing material 130 that overlie the NMOS transistor region 103, as described in greater detail below. In an exemplary embodiment, the thickness of the layer of oxide material 132 is less than about 20 nanometers (nm).

Figure 2:
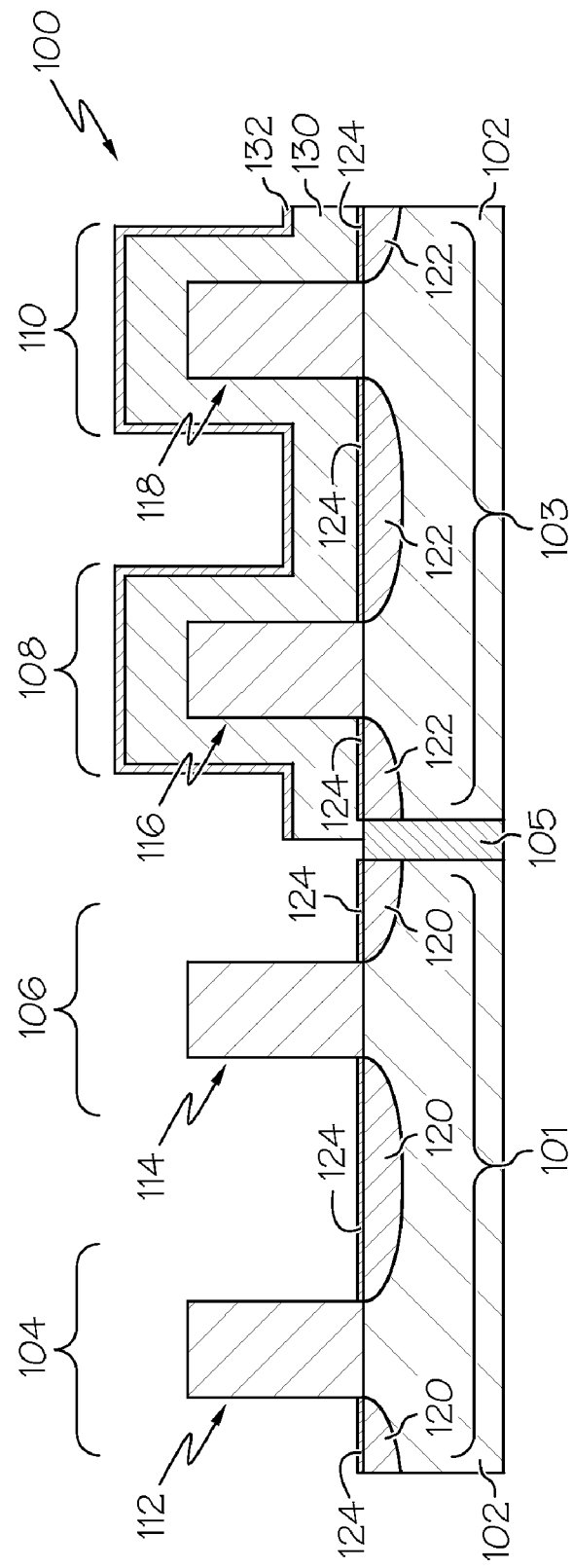

Referring now to FIG. 2, in an exemplary embodiment, the fabrication process continues by masking the NMOS transistor region 103 and removing portions of the tensile stress-inducing nitride material 130 and portions of the oxide material 132 overlying the PMOS transistor region 101. In this regard, a layer of masking material (e.g., a photoresist material) is formed overlying the device structure 100 of FIG. 1, and the portions of the masking material overlying the PMOS transistor region 101 are removed (e.g., using photolithography) to define an etch mask that exposes portions of the oxide material 132 and the tensile stress-inducing material 130 overlying the PMOS transistor region 101. The exposed portions of the tensile stress-inducing nitride material 130 and the oxide material 132 overlying the PMOS transistor region 101 are removed by performing plasma-based reactive ion etching (RIE) to anisotropically etch the tensile stress-inducing nitride material 130 and the oxide material 132 with an anisotropic etchant chemistry using the patterned masking material as an etch mask. Depending on the embodiment, the tensile stress-inducing nitride material 130 and the oxide material 132 may be removed concurrently during a single etch process step, or the oxide material 132 may be removed during a first etch process step and the tensile stress-inducing nitride material 130 removed during a subsequent etch process step. The masking material is resistant to the anisotropic etchant chemistry and/or has a thickness such that the underlying oxide material 132 on the NMOS transistor region 103 is not exposed and remains intact during the etch process step(s). After removing the tensile stress-inducing material 130 and the oxide material 132 from the PMOS transistor region 101, any remaining masking material overlying the NMOS transistor region 103 is removed, resulting in the device structure 100 of FIG. 2.

Figure 3:
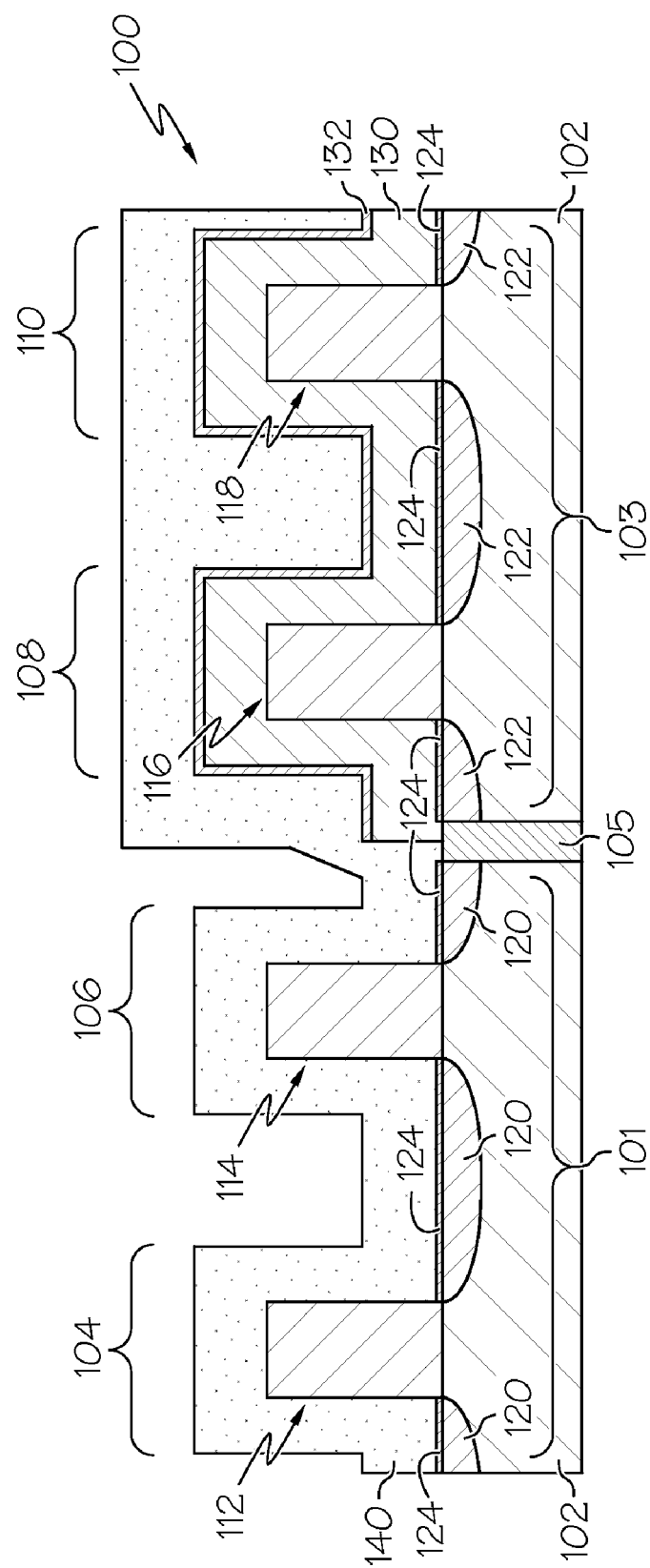

Referring now to FIG. 3, in an exemplary embodiment, the fabrication process continues by forming a layer of a second stress-inducing dielectric material 140 overlying the device structure 100 of FIG. 2. In an exemplary embodiment, the thickness of the layer of the second stress-inducing dielectric material 140 is greater than or equal to the thickness of the first stress-inducing dielectric material 130, however, the subject matter is not intended to be limited to any particular thickness for the second stress-inducing dielectric material 140, and in alternate embodiments, the thickness of the layer of the second stress-inducing dielectric material 140 may be less than the thickness of the first stress-inducing dielectric material 130. In the illustrated embodiment, the thickness of the layer of the second stress-inducing dielectric material 140 is substantially equal to the sum of the thicknesses of the first stress-inducing dielectric material 130 and the oxide material 132.

In an exemplary embodiment, the second stress-inducing material 140 is realized as a compressive stress-inducing material. The layer of compressive stress-inducing material 140 is preferably formed by conformably depositing a layer of compressive stress-inducing silicon nitride using a PECVD process. As described above, the desired amount of compressive stress provided by the deposited layer of silicon nitride material can be modified by adjusting the chamber conditions for the PECVD process to achieve a layer of compressive stress-inducing silicon nitride material 144 having the desired compressive stress properties. For convenience, but without limitation, the second stress-inducing dielectric material 140 is alternatively referred to herein as the compressive stress-inducing nitride material. The compressive stress-inducing nitride material 140 provides a compressive stress that increases the mobility of holes in the channel region of the PMOS transistor structures 104, 106, as will be appreciated in the art.

Figure 4:
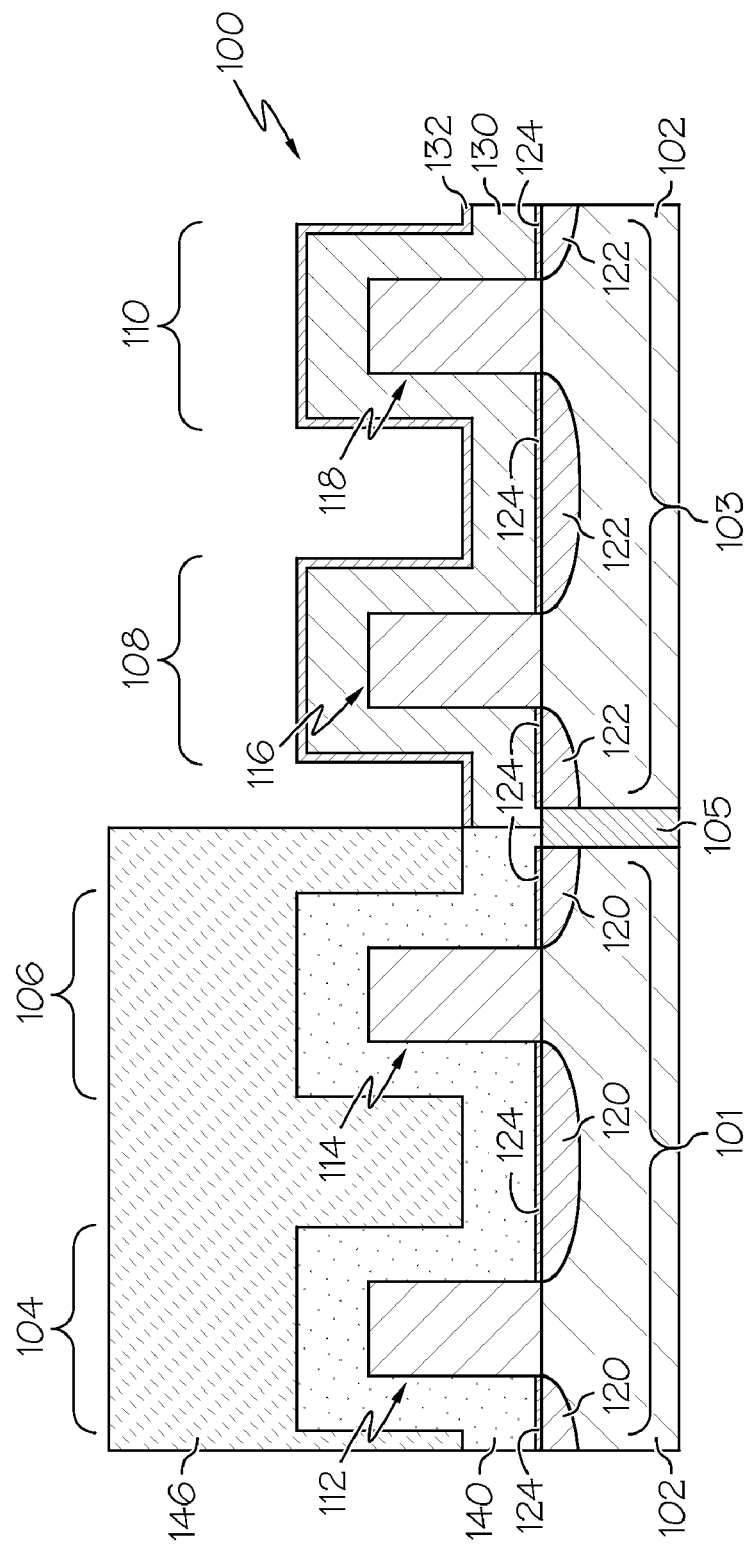

Referring now to FIG. 4, in an exemplary embodiment, after forming the compressive stress-inducing nitride material 140, the fabrication process continues by masking the PMOS transistor region 101 and removing portions of the compressive stress-inducing material 140 overlying the NMOS transistor region 103. In this regard, a layer of masking material 146 is formed overlying the device structure 100 of FIG. 3, and portions of the masking material 146 overlying the NMOS transistor region 103 are removed to define an etch mask that exposes the NMOS transistor region 103. In an exemplary embodiment, the layer of masking material 146 is formed by applying a photoresist material overlying the device structure 100 of FIG. 3, then patterning and removing portions of the photoresist material overlying the NMOS transistor region 103 using photolithography. For convenience, but without limitation, the masking material 146 is alternatively referred to herein as photoresist material. After patterning and removing portions of the photoresist material 146, the exposed portions of the compressive stress-inducing nitride material 140 overlying the NMOS transistor region 103 are removed using the remaining photoresist material 146 as an etch mask. In an exemplary embodiment, the exposed portions of the compressive stress-inducing nitride material 140 are removed using an anisotropic etch process that stops on the oxide material 132, for example, by plasma-based RIE using an anisotropic etchant, such as an argon plasma chemistry, a fluorocarbon-based plasma chemistry, or sulfur hexafluoride ($SF_6$) chemistry, with an applied bias voltage to anisotropically etch the compressive stress-inducing nitride material 140 with good selectivity to the oxide material 132. In this regard, the anisotropic etchant used to etch the compressive stress-inducing nitride material 140 does not etch the underlying oxide material 132 at the same rate or otherwise does not attack the underlying oxide material 132, such that the underlying oxide material 132 acts as an etch stop. The photoresist material 146 prevents the anisotropic etchant from removing portions of the compressive stress-inducing nitride material 140 overlying the PMOS transistor region 101 while the exposed portions of the compressive stress-inducing nitride material 140 overlying the NMOS transistor region 103 are etched until the underlying oxide material 132 is exposed. The photoresist material 146 is preferably resistant to the anisotropic etchant chemistry and/or has a thickness such that the upper surfaces of the compressive stress-inducing nitride material 140 overlying the PMOS transistor region 101 is not exposed during the etch process step.

Figure 5:
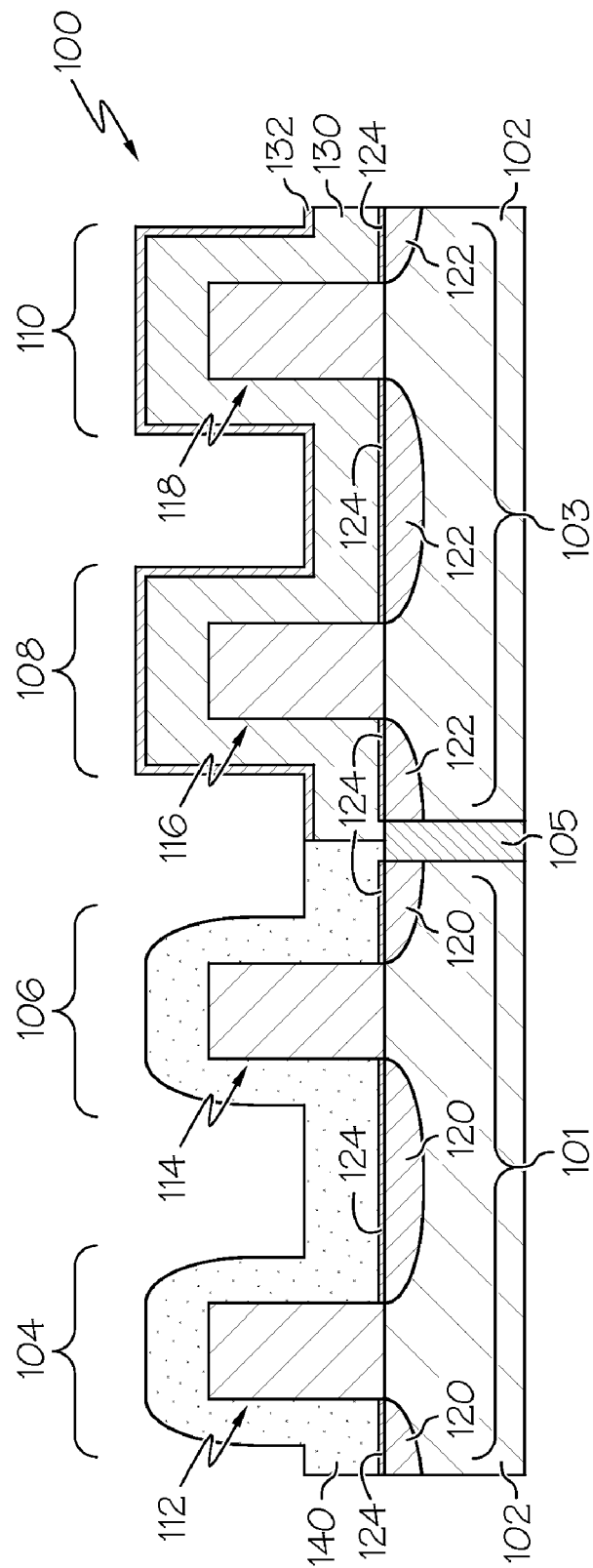

Referring now to FIG. 5, in an exemplary embodiment, the fabrication process continues by removing the photoresist material 146 overlying the PMOS transistor region 101 and isotropically etching the compressive stress-inducing nitride material 140 overlying the PMOS transistor region 101 after the photoresist material 146 is removed. In this regard, the photoresist material 146 may be removed by a photoresist removal process using commonly known etchant chemistries that remove the photoresist material 146 while leaving the oxide material 132 substantially intact. In the illustrated embodiment of FIG. 5, the photoresist material 146 is completely removed, that is, the photoresist material 146 is removed until the compressive stress-inducing nitride material 140 is exposed. After removing the photoresist material 146, the fabrication process continues by isotropically etching the compressive stress-inducing nitride material 144 by plasma etching using an isotropic etchant chemistry to isotropically etch the compressive stress-inducing nitride material 140 with good selectivity to the oxide material 132. In this manner, the oxide material 132 protects the underlying tensile stress-inducing nitride material 130 overlying the NMOS transistor region 103 while the compressive stress-inducing nitride material 140 overlying PMOS transistor region 101 is etched.

In an exemplary embodiment, the operating conditions of the isotropic etch process are modified to etch the upper portions of the compressive stress-inducing nitride material 140, that is, the portions of the compressive stress-inducing nitride material 140 on top of or adjacent to the sidewalls of the gate structures 112, 114, at a faster rate than the lower portions of the compressive stress-inducing nitride material 140, that is, the portions of the compressive stress-inducing material 140 overlying the doped source/drain regions 120. For example, in an exemplary embodiment, the isotropic plasma etch process is performed using a carbon trifluoride/oxygen/helium ($CHF_3/O_2/He$) plasma without applying a bias voltage to achieve higher mass transport rates at or near the upper portions of the gate structures 112, 114 than between or otherwise adjacent to lower portions of the gate structures 112, 114, such that the etch rate increases as distance from the underlying semiconductor substrate 102 increases. Thus, although the portions of the compressive stress-inducing nitride material 140 overlying the gate structures 112, 114 and the portions of the compressive stress-inducing material 140 overlying the doped source/drain regions 120 are etched concurrently during the isotropic etch process, by virtue of the etch rate being greater for the portions of the compressive stress-inducing nitride material 140 overlying the gate structures 112, 114, the isotropic etch process rounds the corners of the compressive stress-inducing nitride material 140 on top of the gate structures 112, 114 without significantly reducing the thickness of the compressive stress-inducing nitride material 140 adjacent to the gate structures 112, 114 and nearest to the semiconductor substrate 102 (e.g., the portions of the compressive stress-inducing nitride material 140 in contact with the contact regions 124).

Figure 6:
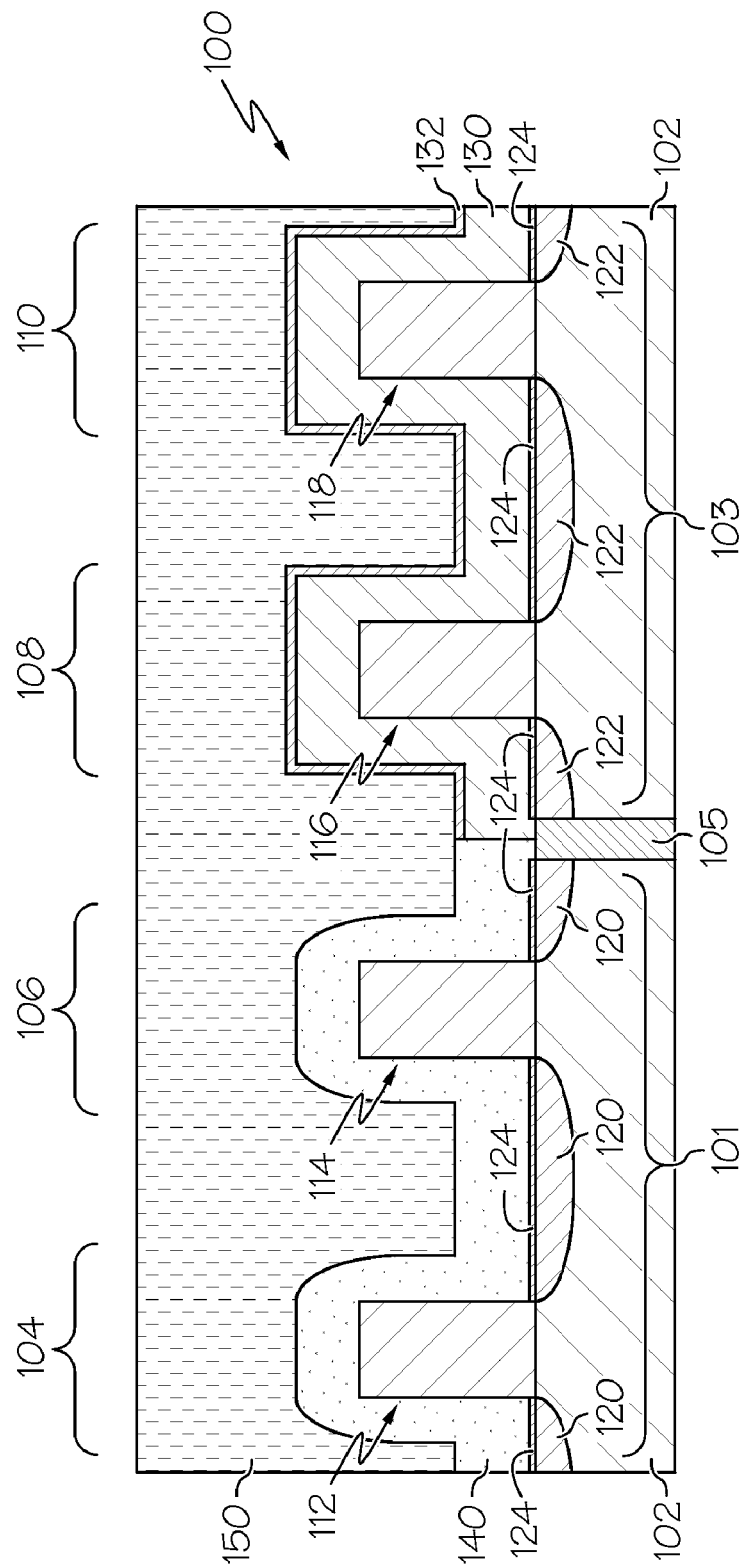

Referring now to FIG. 6, in an exemplary embodiment, the fabrication process begins by forming a layer of dielectric material 150 overlying the device structure 100 of FIG. 5, resulting in the device structure 100 of FIG. 6. In an exemplary embodiment, the layer of dielectric material 150 is realized as a layer of an oxide material, such as silicon dioxide, that is conformably deposited overlying the device structure 100 of FIG. 5 to a thickness chosen such that the oxide material 150 fills any gaps between neighboring gate structures 112, 114, 116, 118 to a minimum height that meets or exceeds the height of the gate structures 112, 114, 116, 118, or in other words, the thickness of the oxide material is greater than or equal to the difference between the height of the gate structures 112, 114, 116, 118 and the thickness of the layer of the compressive stress-inducing nitride material 140. For example, a layer of silicon dioxide be formed by CVD or atomic layer deposition (ALD) at a temperature that is less than about 500° C. until the gaps between the gate structures 112, 114, 116, 118 are completely filled to a height above the gate structures 112, 114, 116, 118. For convenience, but without limitation, the dielectric material 150 is alternatively referred to herein as an oxide material.

Figure 7:
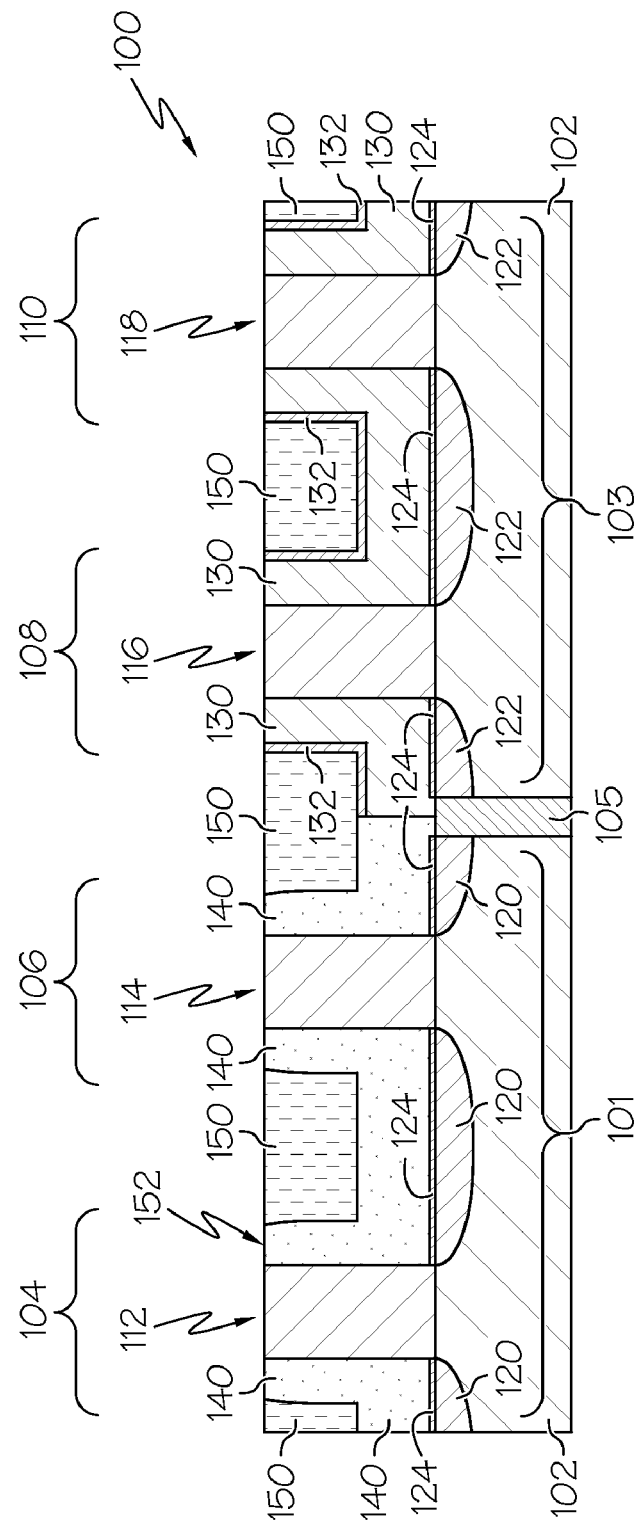

Referring now to FIG. 7, in an exemplary embodiment, after forming the layer of oxide material 150, the fabrication process continues by removing portions of the dielectric materials 130, 132, 140, 150 to obtain a substantially planar surface 152 that is aligned with the upper surface of the gate structures 112, 114, 116, 118, resulting in the device structure 100 illustrated by FIG. 7. In an exemplary embodiment, the fabrication process planarizes the dielectric materials 130, 132, 140, 150 to remove portions of the dielectric materials 130, 132, 140, 150 across the semiconductor substrate 102 until reaching the upper surface of the gate structures 112, 114, 116, 118. In other words, the fabrication process ceases planarizing the dielectric materials 130, 132, 140, 150 when the upper surfaces of the gate structures 112, 114, 116, 118 are exposed. In accordance with one embodiment, chemical-mechanical planarization (CMP) is used to polish the dielectric materials 130, 132, 140, 150 with a chemical slurry for a predetermined amount of time such that the CMP stops when the upper surfaces of the gate structures 112, 114, 116, 118 are exposed. Alternative endpoint detection techniques could also be utilized to determine when to stop the CMP procedure, or alternative planarization techniques may be used to obtain the substantially planar surface 152 that is aligned with the upper surfaces of the gate structures 112, 114, 116, 118.

Figure 8:
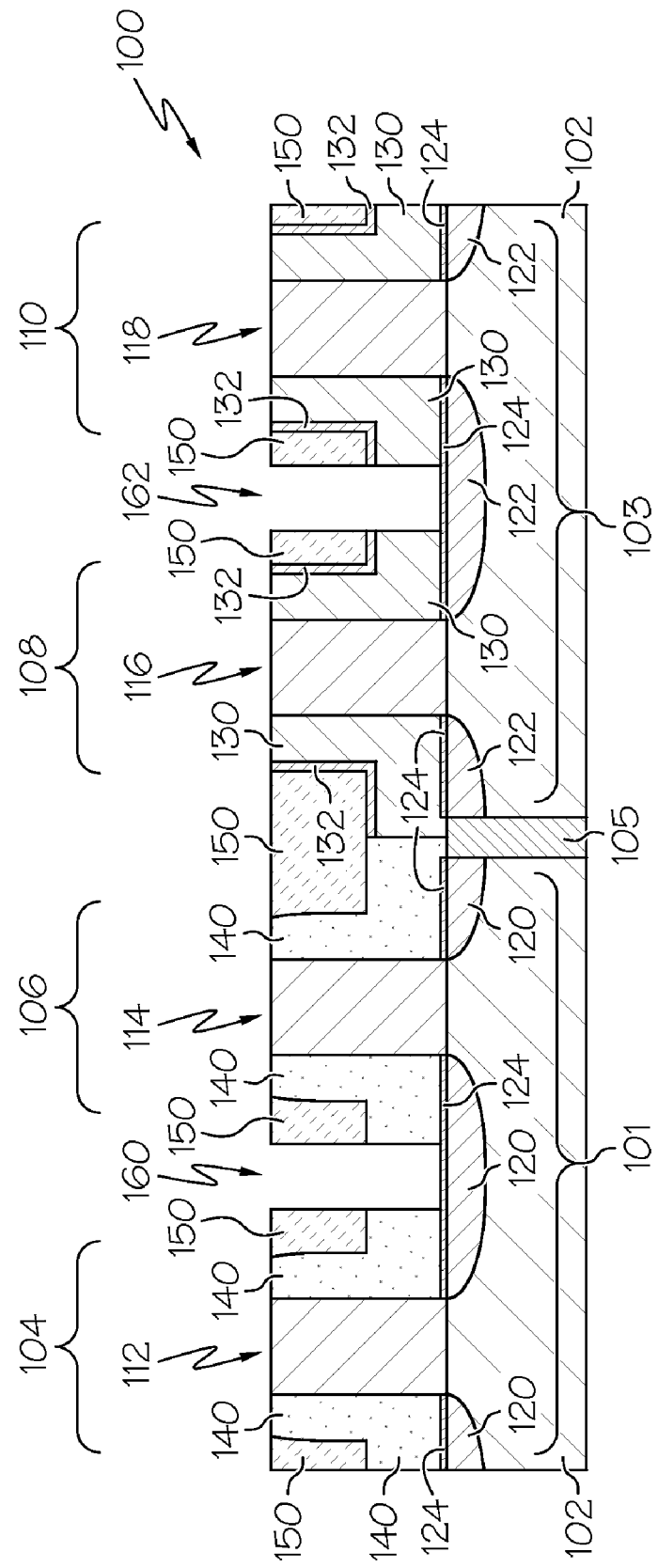
Figure 9:
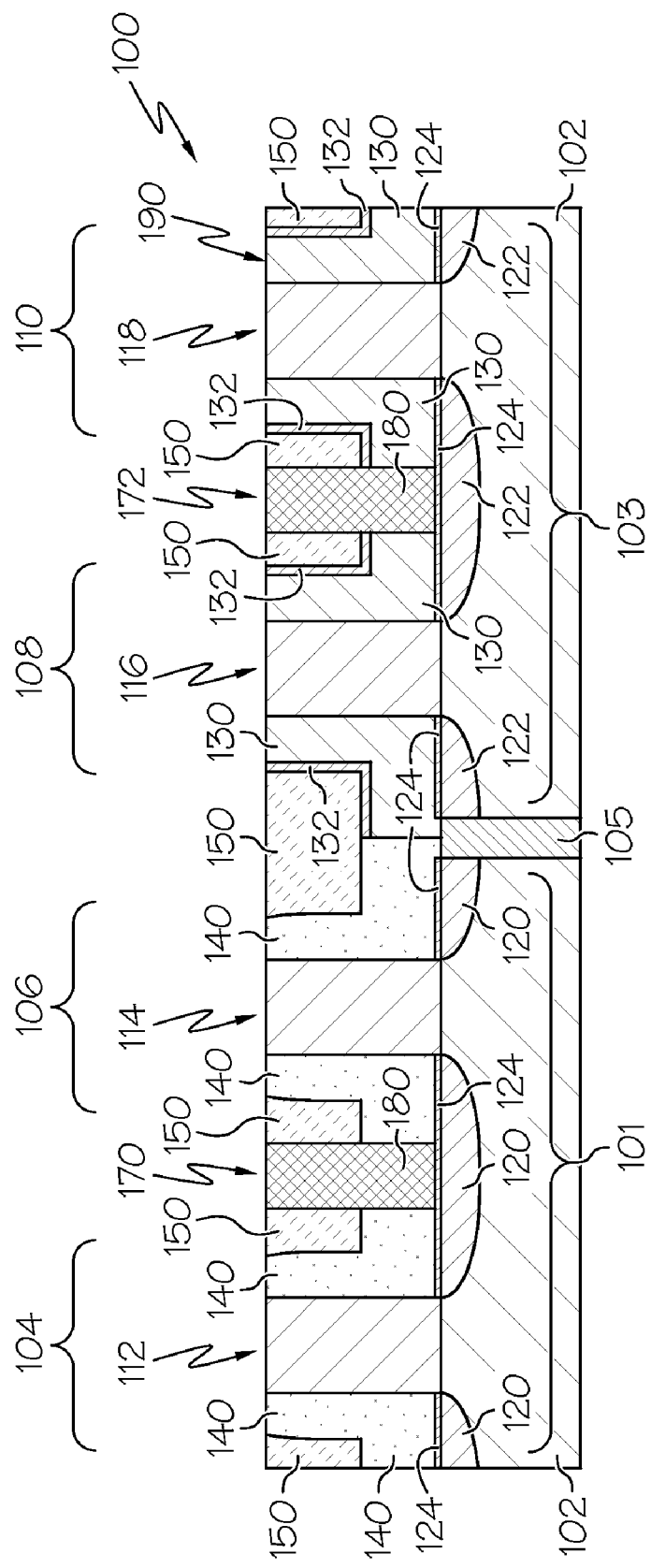

Referring now to FIGS. 8-9, in an exemplary embodiment, after the planarization step, the fabrication process continues by selectively removing portions of the dielectric materials 130, 132, 140, 150 to create voided regions (or holes) 160, 162 overlying the source/drain regions 120, 122 and forming local contacts 170, 172 in the voided regions 160, 162. In this regard, the voided regions 160, 162 define the lateral dimensions of the local contacts 170, 172 subsequently formed therein. In this regard, the fabrication process forms a layer of masking material overlying the planar surface 152, and portions of the masking material are selectively removed to define a mask that exposes portions of the oxide material 150 overlying the source/drain regions 120, 122 that will subsequently be removed to create the voided regions 160, 162 while leaving the portions of the masking material overlying the gate structures 112, 114, 116, 118 intact. In an exemplary embodiment, portions of the dielectric materials 130, 132, 140, 150 adjacent to the gate structures 112, 114, 116, 118 are protected by the masking material to electrically isolate the subsequently formed local contacts 170, 172 from adjacent gate structures 112, 114, 116, 118. After patterning the masking material, the fabrication process continues by selectively removing portions of the dielectric materials 130, 132, 140, 150 using the patterned masking material as an etch mask. In an exemplary embodiment, the exposed portions of oxide material 132, 150 are removed using an anisotropic (or directional) etch process that stops on the stress-inducing nitride material 130, 140, for example, by plasma-based RIE using an anisotropic etchant chemistry that is selective to oxide material without attacking nitride material, such that the underlying nitride material 130, 140 acts as an etch stop. In one embodiment, after removing exposed portions of the oxide material 132, 150, the exposed portions of the nitride material 130, 140 are removed using an anisotropic etchant until the contact regions 124 are exposed. After removing exposed portions of the nitride material 130, 140 to form the voided regions 160, 162, the fabrication process continues by removing any remaining masking material in a conventional manner.

After creating voided regions 160, 162 that expose the contact regions 124, the fabrication process continues by forming local contacts 170, 172 in the voided regions 160, 162. In this regard, the local contacts 170, 172 are realized as a conductive material 180 that provides an electrical connection to source/drain regions 120, 122. The local contacts 170, 172 are preferably formed by conformably depositing a conductive material 180, such as a tungsten material, to a thickness chosen such that the conductive material 180 fills the voided regions 160, 162 to a minimum height that meets or exceeds the height of the gate structures 112, 114, 116, 118 (e.g., a "flush" fill or overfill). In an exemplary embodiment, the local contacts 170, 172 are formed by conformably depositing tungsten by CVD or ALD at a temperature less than about 500° C. to a thickness that is substantially equal to or slightly greater than the height of the gate structures 112, 114, 116, 118. In this regard, a tungsten material is capable of completely filling the voided regions 160, 162 and contacting the contact regions 124 to provide a conductive electrical connection between the source/drain regions 120, 122 and a subsequently formed metal interconnect layer via the contact regions 124 and local contacts 170, 172 without diffusing to the semiconductor substrate 102 and/or contact regions 124. Although not illustrated, it should be noted that in some embodiments, a relatively thin layer of a barrier material may be formed in the voided regions 160, 162 prior to forming the layer of conductive material 180. After forming the layer of conductive material 180 for the local contacts 170, 172, the fabrication process continues by planarizing the CMOS device structure 100 to remove portions of the conductive material 180 that did not fill the voided regions to obtain a substantially planar surface 190 that is aligned with the upper surface of the gate structures 112, 114, 116, 118, resulting in the CMOS semiconductor device structure 100 of FIG. 9. In this regard, the conductive material 180 is uniformly removed across the CMOS semiconductor device structure 100 until reaching the gate structures 112, 114, 116, 118, for example, by performing CMP to polish the conductive material 180 with a chemical slurry and stopping when the upper surfaces of the gate structures 112, 114, 116, 118 are exposed, in a similar manner as described above.

After forming the local contacts, the fabrication process may continue by performing well known back end of line (BEOL) process steps to complete fabrication of the CMOS semiconductor device structure 100 in a conventional manner. For example, the through-contact fabrication process may proceed by forming an interlayer dielectric material overlying the planar surface 190, forming vias in the interlayer dielectric material, and forming a metal interconnect layer (e.g., Metal 1) overlying the interlayer dielectric material, and repeating these metallization steps until all of the necessary metal interconnect layers have been formed.

Figure 10:
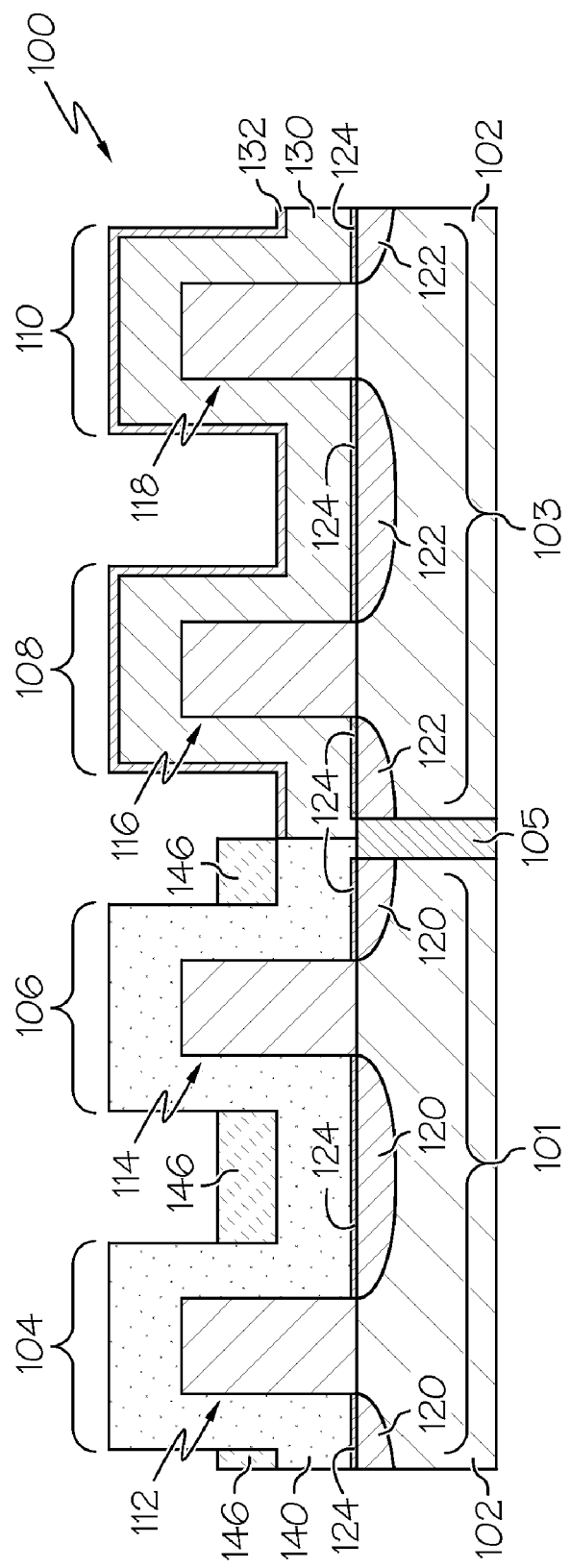
FIG. 10 is a cross-sectional view that illustrates a CMOS semiconductor device structure and related methods for fabricating the CMOS semiconductor device structure in accordance with one embodiment.

FIG. 10 illustrates an alternate embodiment of the fabrication process described above. In the alternate embodiment, after removing the compressive stress-inducing nitride material 140 from the NMOS transistor region 103, the photoresist material 146 overlying the PMOS transistor region 101 is only partially removed before isotropically etching the compressive stress-inducing nitride material 140 overlying the PMOS transistor region 101. In this regard, the photoresist material 146 may be partially removed by performing a photoresist removal process for a predetermined amount of time that removes the portions of the photoresist material 146 overlying the gate structures 112, 114 while leaving the portions of the photoresist material 146 adjacent to the gate structures 112, 114 and overlying the doped source/drain regions 120 substantially intact. In an exemplary embodiment, the photoresist material 146 is removed until the height of the photoresist material 146 disposed between adjacent gate structures 112, 114 and overlying the doped source/drain regions 120 is less than the height of the gate structures 112, 114. After partially removing the photoresist material 146, the fabrication process continues by isotropically etching the compressive stress-inducing nitride material 140 using an isotropic etchant chemistry that is selective to the oxide material 132 in a similar manner as described above in the context of FIG. 5. In this regard, the photoresist material 146 protects the compressive stress-inducing nitride material 140 overlying the doped source/drain regions 120 adjacent to gate structures 112, 114 while isotropically etching the compressive stress-inducing material 140 on top of the gate structures 112, 114 and/or adjacent to the sidewalls of the gate structures 112, 114. In this manner, the isotropic etch process rounds the upper corners of the compressive stress-inducing nitride material 140 on top of the gate structures 112, 114 without reducing the thickness of the compressive stress-inducing nitride material 140 overlying the source/drain regions 120. After isotropically etching the exposed portions of the compressive stress-inducing nitride material 140, the fabrication process continues by removing the remaining portions of the photoresist material 146 and completing fabrication of local contacts 170, 172 for the CMOS semiconductor device structure 100 as described in the context of FIGS. 6-9.

To briefly summarize, one advantage of the fabrication processes described herein is that by isotropically etching the compressive stress-inducing nitride material 140 to round the corners near the top of the gate structures 112, 114, the oxide material 150 is capable of filling the gaps between the PMOS gate structures 112, 114 completely and without any voids between the PMOS gate structures 112, 114 after depositing the oxide material 150, which in turn, prevents undesirable electrical connections that may otherwise be created when the conductive material 180 for the local contacts 170, 172 is conformably deposited overlying the semiconductor substrate 102. It should be appreciated that although the subject matter is described herein in the context of isotropically etching the compressive stress-inducing nitride material 140 for the PMOS transistors 104, 106, in practice, the subject matter may also be implemented in an equivalent manner to isotropically etch the tensile stress-inducing nitride material 130 for the NMOS transistors 108, 110. For example, in accordance with one embodiment, after forming the layer of the tensile stress-inducing nitride material 130 and before forming the layer of oxide material 132, the tensile stress-inducing nitride material 130 may be isotropically etched using an isotropic etch process that is modified to etch the upper portions of the tensile stress-inducing nitride material 130 (e.g., the portions of the tensile stress-inducing nitride material 130 on top gate structures 112, 114, 116, 118 and/or or adjacent to sidewalls of the gate structures 112, 114, 116, 118) at a faster rate than the lower portions of the tensile stress-inducing nitride material 130 (e.g., the portions of the tensile stress-inducing nitride material 130 overlying the doped source/drain regions 120, 122 adjacent to gate structures 112, 114, 116, 118) to achieve better rounding of the corners of the tensile stress-inducing nitride material 130 on top of the gate structures 116, 118 without reducing the thickness of the tensile stress-inducing nitride material 130 between adjacent to the gate structures 116, 118 overlying the doped source/drain regions 122. In this embodiment, after isotropically etching the tensile stress-inducing nitride material 130, the fabrication process continues by forming the layer of oxide material 132 and removing portions of the tensile stress-inducing nitride material 130 and the oxide material 132 from the PMOS transistor region 101, as described above in the context of FIGS. 1-2, before completing fabrication of local contacts for the CMOS semiconductor device structure. In yet other embodiments, the order in which the tensile and compressive stress-inducing dielectric materials are formed may be interchanged, in which case, the first stress-inducing dielectric material 130 may be realized as a compressive stress-inducing material that is removed from the NMOS region 103, and the second stress-inducing dielectric material 140 may be realized as a tensile stress-inducing nitride material that is isotropically etched using an isotropic etch process after being removed from the PMOS region 101, in a similar manner as described above.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device including a gate structure overlying a semiconductor substrate and a doped region formed in the semiconductor substrate adjacent to the gate structure, the method comprising:

forming a first layer of dielectric material overlying the gate structure and the doped region;

isotropically etching the first layer of dielectric material, wherein isotropically etching the first layer of dielectric material comprises concurrently etching a first portion of the first layer overlying the gate structure at a first etch rate and a second portion of the first layer overlying the doped region at a second etch rate, the first etch rate being greater than the second etch rate;

forming a second layer of dielectric material overlying the first layer of dielectric material after isotropically etching the first layer; and forming a conductive contact within the first layer and the second layer, the conductive contact being electrically connected to the doped region.

2. The method of claim 1, further comprising forming a masking material overlying a portion of the first layer prior to isotropically etching the first layer, the portion of the first layer overlying the doped region.

3. The method of claim 2, wherein forming the masking material overlying the doped region comprises:

forming a photoresist material overlying the first layer; and removing a first portion of the photoresist material overlying the gate structure while leaving a second portion of the photoresist material overlying the doped region intact.

4. The method of claim 3, wherein:

isotropically etching the first layer comprises isotropically etching the first layer using the second portion of the photoresist material as an etch mask; and the second portion of the photoresist material prevents etching of the portion of the first layer overlying the doped region.

5. The method of claim 1, wherein forming the second layer comprises conformably depositing an oxide material overlying the first layer.

6. The method of claim 5, wherein conformably depositing the oxide material overlying the first layer comprises conformably depositing the oxide material to a thickness chosen such that a height of the oxide material overlying the doped region is greater than or equal to a height of the gate structure.

7. The method of claim 6, further comprising planarizing the first layer and the second layer to obtain a planar surface aligned with the gate structure prior to forming the conductive contact.

8. The method of claim 1, wherein forming the first layer comprises conformably depositing a tensile stress-inducing material overlying the gate structure and the doped region.

9. The method of claim 1, wherein forming the first layer comprises conformably depositing a compressive stress-inducing material overlying the gate structure and the doped region.

10. A method for fabricating a CMOS device on a semiconductor substrate having a first transistor region and a second transistor region, the method comprising:

forming a first layer of a first stress-inducing material overlying the first transistor region and the second transistor region;

removing portions of the first layer overlying the second transistor region;

isotropically etching portions of the first layer overlying the first transistor region after removing the portions of the first layer overlying the second transistor region;

forming a second layer of a dielectric material overlying the first transistor region and the second transistor region; and forming conductive contacts in the second layer of the dielectric material, the conductive contacts being electrically connected to doped regions formed in the semiconductor substrate.

11. The method of claim 10, further comprising:

forming a third layer of a second stress-inducing material overlying the first transistor region and the second transistor region; and removing portions of the third layer overlying the first transistor region prior to forming the first layer of the first stress-inducing material.

12. The method of claim 11, further comprising:

forming a fourth layer of an oxide material overlying third layer prior to removing portions of the third layer; and removing portions of the fourth layer overlying the first transistor region prior to forming the first layer of the first stress-inducing material, wherein isotropically etching the portions of the first layer overlying the first transistor region comprises isotropically etching the portions of the first layer using an isotropic etchant that is selective to the oxide material overlying the second transistor region.

13. The method of claim 11, further comprising isotropically etching the third layer of the second stress-inducing material prior to removing the portions of the third layer overlying the first transistor region.

14. The method of claim 10, wherein:

the first transistor region comprises an N-type region of the semiconductor substrate;

the second transistor region comprises a P-type region of the semiconductor substrate; and forming the first layer comprises conformably depositing a compressive stress-inducing nitride material overlying the N-type region and the P-type region.

15. The method of claim 14, further comprising:

conformably depositing a tensile stress-inducing nitride material overlying the N-type region and the P-type region;

forming a third layer of an oxide material overlying tensile stress-inducing nitride material; and removing portions of the tensile stress-inducing nitride material and the oxide material overlying the N-type region prior to conformably depositing the compressive stress-inducing nitride material.

16. The method of claim 15, wherein isotropically etching portions of the first layer overlying the first transistor region comprises isotropically etching the compressive stress-inducing nitride material using an isotropic etchant that is selective to the oxide material overlying the P-type region.

17. The method of claim 10, the CMOS device including a plurality of gate structures overlying the first transistor region, wherein:

forming the second layer comprises conformably depositing an oxide material overlying the plurality of gate structures to a thickness greater than a difference between a height of the plurality of gate structures and a thickness of the first layer; and the method further comprises planarizing the oxide material to obtain a planar surface aligned with the plurality of gate structures prior to forming the conductive contacts.

18. The method of claim 10, wherein:

the first transistor region comprises a P-type region of the semiconductor substrate;

the second transistor region comprises an N-type region of the semiconductor substrate; and forming the first layer comprises conformably depositing a tensile stress-inducing nitride material overlying the N-type region and the P-type region.

19. A method of fabricating a semiconductor device including a plurality of gate structures overlying a semiconductor substrate and doped regions formed in the semiconductor substrate adjacent to each respective gate structure of the plurality of gate structures, the method comprising:

conformably depositing a stress-inducing nitride material overlying the plurality of gate structures and the doped regions;

isotropically etching portions of the stress-inducing nitride material overlying the plurality of gate structures;

conformably depositing an oxide material overlying the stress-inducing nitride material after isotropically etching the portions of the stress-inducing nitride material overlying the plurality of gate structures;

planarizing the stress-inducing nitride material and the oxide material to obtain a planar surface aligned with each respective gate structure of the plurality of gate structures; and forming conductive contacts in the oxide material overlying the doped regions after planarizing the stress-inducing nitride material and the oxide material, each conductive contact being electrically connected to a respective doped region.

20. The method of claim 19, wherein isotropically etching portions of the stress-inducing nitride material comprises concurrently etching a first portion of the stress-inducing nitride material overlying the plurality of gate structures at a first etch rate and a second portion of the stress inducing nitride material overlying the doped regions at a second etch rate, the first etch rate being greater than the second etch rate.

* * * * *